(12) United States Patent
Johnson et al.

(10) Patent No.: US 11,916,518 B2
(45) Date of Patent: *Feb. 27, 2024

(54) ANALOG BIAS CONTROL OF RF AMPLIFIERS

(71) Applicant: SKYWORKS SOLUTIONS, INC., Irvine, CA (US)

(72) Inventors: Douglas M. Johnson, Doylestown, PA (US); Guillaume Alexandre Blin, Carlisle, MA (US); Michael John Mitzen, Hillsborough, NJ (US); Jung Hee Lee, Burlington, MA (US); Weize Xu, Acton, MA (US); Attila Kalamar, Franklin, NJ (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/659,870

(22) Filed: Apr. 20, 2022

(65) Prior Publication Data

US 2022/0247359 A1    Aug. 4, 2022

Related U.S. Application Data

(63) Continuation of application No. 17/007,056, filed on Aug. 31, 2020, now Pat. No. 11,329,609.

(60) Provisional application No. 62/905,590, filed on Sep. 25, 2019.

(51) Int. Cl.
  H03F 1/34    (2006.01)
  H03F 1/02    (2006.01)
  H03F 3/195   (2006.01)

(52) U.S. Cl.
  CPC ........... *H03F 1/0233* (2013.01); *H03F 3/195* (2013.01); *H03F 2200/462* (2013.01); *H03F 2200/471* (2013.01); *H03F 2200/481* (2013.01)

(58) Field of Classification Search
  CPC ...................................................... H03F 1/34
  USPC .................................................... 330/85, 97
  See application file for complete search history.

(56) References Cited

U.S. PATENT DOCUMENTS

| | | | |
|---|---|---|---|
| 9,541,932 B2 * | 1/2017 | Heiling | G05F 1/56 |
| 9,958,891 B1 * | 5/2018 | Furth | G05F 1/575 |
| 10,103,696 B1 * | 10/2018 | Mitzlaff | H01L 29/0696 |
| 10,587,227 B2 | 3/2020 | Takano et al. | |
| 10,771,020 B1 * | 9/2020 | Britz | H03F 3/2171 |
| 2021/0091724 A1 | 3/2021 | Johnson et al. | |

* cited by examiner

*Primary Examiner* — Henry Choe
(74) *Attorney, Agent, or Firm* — Lando & Anastasi, LLP

(57) ABSTRACT

Examples provide methods and apparatus for controlling a DC bias current in an RF amplifier. In one example where the RF amplifier is implemented on an amplifier die, a reference voltage is produced across a reference resistor implemented on the amplifier die, the DC bias current is measured, and a current controller, which is implemented on a controller die that is separate from the amplifier die, operates a feedback loop using the reference voltage to control a level of the DC bias current.

20 Claims, 11 Drawing Sheets

ANALOG BIAS CONTROL OF RF AMPLIFIERS

CROSS-REFERENCE TO RELATED APPLICATIONS

This application claims priority under 35 U.S.C. § 120 as a continuation of U.S. patent application Ser. No. 17/007,056, titled ANALOG BIAS CONTROL OF RF AMPLIFIERS, filed Aug. 31, 2020, which claims priority under 35 U.S.C. § 119(e) to U.S. Provisional Patent Application Ser. No. 62/905,590, titled ANALOG BIAS CONTROL OF RF AMPLIFIERS, filed Sep. 25, 2019, each of which is incorporated herein by reference in its entirety for all purposes.

BACKGROUND

The DC bias current in certain amplifiers, such as those used in CATV applications, needs to be set and controlled tightly in order to meet performance specifications. The conventional approach to controlling the DC bias current relies on laser trimming DC bias resistors on the circuit board or die during production (manufacture) of the amplifier modules, for example, during the die sorting phase. This process is expensive, and as applications start to require increased total current (for example, on the order of about 760 milliamps (mA)) and DC power dissipation, may not be accurate enough to meet stringent performance specifications. For example, in an application where the bias current is around 760 mA, a variation of even 10% (~76 mA) may be too much to meet the relevant specifications.

SUMMARY OF INVENTION

Aspects and embodiments are directed to control circuitry that can provide adjustable control of the DC bias current in amplifiers and eliminates the need for costly on-die laser trimming to set the current, whether at the die sorting phase or another stage during manufacture.

According to one embodiment, an amplifier module comprises a radio frequency (RF) amplifier, a current sensing resistor connected to the RF amplifier, a sense voltage measured across the current sensing resistor being indicative of a DC bias current in the RF amplifier, a reference resistor, and a current controller including a current source and a feedback amplifier, the feedback amplifier having an output connected to a gate node of the RF amplifier, a first input connected to the reference resistor, and a second input connected to the current sensing resistor, the current source being configured to apply a first current to the reference resistor to produce a reference voltage at the first input of the feedback amplifier, the feedback amplifier being configured to produce a control voltage at the gate node to drive the RF amplifier to adjust the DC bias current to equalize the sense voltage and the reference voltage.

In one example, the output of the feedback amplifier is connected to the gate node of the RF amplifier via a gate resistor.

In another example, the RF amplifier, the current sensing resistor, and the reference resistor are implemented on an amplifier die, and wherein the current controller is implemented on a controller die separate from the amplifier die.

In one example, the current controller includes a first filter connected to the output of the feedback amplifier. In one example, the first filter includes a first series resistor connected between the output of the feedback amplifier and the gate node, and a first shunt capacitor connected between the first series resistor and ground. In another example, the first filter includes a second order resistive-capacitive (RC) filter.

In one example, the RF amplifier is a differential amplifier.

In another example, the current controller includes chopper circuitry coupled to the feedback amplifier and configured to reduce an offset voltage of the feedback amplifier.

In another example, the current controller has at least one user-adjustable parameter, and wherein the current controller includes a control input configured to receive a control signal to adjust the at least one user-adjustable parameter.

In one example, the current source is programmable and wherein a value of the first current is controllable via a programming interface connected to the current source.

In another example, the current controller includes a control input configured to receive a control signal, and wherein a value of the first current is trimmable via the control signal.

According to another embodiment, an amplifier module comprises a radio frequency (RF) amplifier implemented on an amplifier die, a sense resistor implemented on the amplifier die and connected to the RF amplifier, a sense voltage measured across the current sensing resistor being indicative of a DC bias current in the RF amplifier, a reference resistor implemented on the amplifier die, and a current controller implemented on a controller die separate from the amplifier die, the current controller being coupled to the RF amplifier, the sense resistor and the reference resistor, and configured to produce a reference voltage across the reference resistor and to drive a gate voltage applied to a gate node of the RF amplifier to control a DC bias current in the RF amplifier based on the sense voltage and the reference voltage.

In one example, the controller die includes a first contact for connection to the reference resistor, a second contact for connection to the sense resistor, and a third contact for connection to the gate node of the RF amplifier.

In one example, the current controller includes a feedback amplifier having an output connected to the third contact, a first input connected to the first contact, and a second input connected to the third contact, the feedback amplifier being configured to receive the reference voltage at the first input, to receive the sense voltage at the second input, and to produce a control voltage at the output. In another example, the amplifier die includes a first amplifier contact for connection to the output of the feedback amplifier, and wherein the amplifier module further comprises a gate resistor implemented on the amplifier die and connected between the gate node of the RF amplifier and the first amplifier contact. The amplifier module may further comprise a shunt resistor connected to ground in parallel with the reference resistor. The amplifier module may further comprise a pull-up resistor connected from the reference resistor to a supply voltage.

In one example, the current controller further includes a first voltage reference and a voltage regulator, each connected to a supply contact on the controller die and configured to receive a supply voltage via the supply contact, the voltage regulator being further connected to a supply terminal of the feedback amplifier. In another example, the current controller further includes programmable voltage reference configured to receive outputs from the first voltage reference and the voltage regulator, and output of the programmable voltage reference being connected to the first contact and configured to supply a drive current to the reference resistor to produce the reference voltage. The current controller may further include a digital regulator, control logic, and programming circuitry. In one example, the current controller has at least one user-adjustable parameter, and wherein the programming circuitry is configured to receive a control signal to adjust the at least one user-adjustable parameter. The at least one user-adjustable parameter may include a temperature-dependence profile of the DC bias current, for example.

In one example, the programming circuitry is coupled to the programmable voltage reference, wherein the programmable voltage reference includes a plurality of different operating modes, and wherein the programming circuitry is configured to select one of the plurality of operating modes based on the control signal. The at least one user-adjustable parameter may include a value of a reference current that produces the reference voltage across the reference resistor, for example.

In one example, the current controller further includes a filter coupled between the voltage regulator and the supply terminal of the feedback amplifier. In one example, the filter includes a resistor connected in series between the voltage regulator and the supply terminal of the feedback amplifier and a shunt capacitor connected between the supply terminal and ground.

In another example, the current controller further includes chopper circuitry coupled to the feedback amplifier and configured to reduce an offset voltage of the feedback amplifier. In one example, the current controller is further configured to compensate for the offset voltage by adjusting a value of a reference current that produces the reference voltage across the reference resistor.

In another example, the RF amplifier is a differential amplifier including a pair of complementary transistor amplifiers, and a pair of gate resistors connected between gates of the pair of complementary transistor amplifiers and the gate node. In one example, the sense resistor is connected to a common virtual ground node between the pair of complementary transistor amplifiers. The amplifier module may further comprise a first resistive-capacitive (RC) filter implemented on the controller die and coupled between the output of the feedback amplifier and the third contact. In one example, the first RC filter includes a first series resistor connected between the output of the feedback amplifier and the third contact, and a first shunt capacitor connected between the third contact and ground. In another example, the amplifier die includes a first amplifier contact for connection to the output of the feedback amplifier, the amplifier module further comprising an external capacitor not implemented on either the amplifier die or the controller die, the external capacitor being coupled to the third contact on the controller die and to the first amplifier contact on the amplifier die.

The amplifier module may further comprise a package configured to house the controller die and the amplifier die, the package including a plurality of connection leads. In one example, the third contact on the controller die is connected to a first connection lead of the plurality of connection leads of the package, the first amplifier contact is connected to a second connection lead of the plurality of connection leads of the package, and the external capacitor is connected to the first and second connection leads. In one example, a connection of the external capacitor to the first and second connection leads includes a Kelvin connection. In another example, the first and second connection leads are adjacent to one another.

In one example, first RC filter includes a second order RC filter and an additional resistor connected in series between the second order RC filter and the third contact.

The amplifier module may further comprise a second RC filter implemented on the amplifier die and coupled between the gate node and the first amplifier contact.

Another embodiment is directed to a method of controlling a DC bias current in an RF amplifier implemented on an amplifier die. According to one embodiment, the method comprises producing a reference voltage across a reference resistor implemented on the amplifier die, measuring the DC bias current, and operating a feedback loop in a current controller using the reference voltage to control a level of the DC bias current, the current controller being implemented on a controller die separate from the amplifier die.

In one example, measuring the DC bias current includes receiving a sense voltage at the current controller, the sense voltage being produced across a sense resistor by the DC bias current, the sense resistor being implemented on the amplifier die.

In another example, operating the feedback loop includes receiving the reference voltage at a first input of a feedback amplifier, receiving the sense voltage at a second input of the feedback amplifier, producing a control voltage at an output of the feedback amplifier, and driving a gate node of the RF amplifier with the control voltage to control the level of the DC bias current.

The method may further comprise filtering the control voltage.

In one example, producing the reference voltage includes generating a reference current with the current controller, and applying the reference current to the reference resistor.

The method may further comprise trimming a value of the reference current to compensate for an offset value of the feedback amplifier.

In one example, the method further comprises adjusting a temperature-dependence profile of the DC bias current using the current controller.

In another example, the method further comprises adjusting the level of the DC bias current by altering a resistance value of the reference resistor. In one example, adjusting the level of the DC bias current includes lowering the level of the DC bias current by connecting a shunt resistor to ground in parallel with the reference resistor. In another example, adjusting the level of the DC bias current includes raising the level of the DC bias current by connecting a pull-up resistor from the reference resistor to a supply voltage.

The method may further comprise adjusting at least one characteristic of the current controller via a control interface on the controller die.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
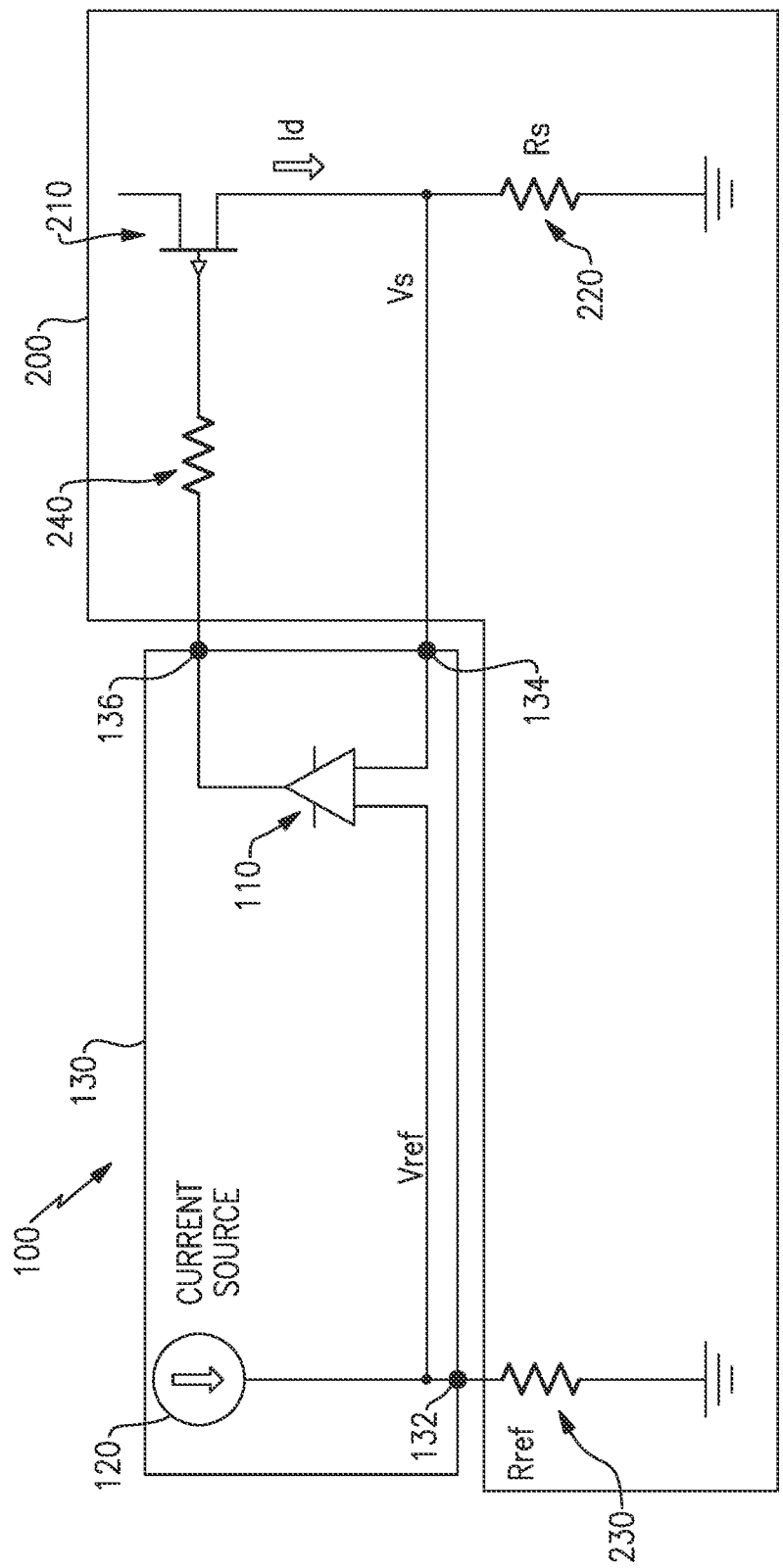
FIG. 1 is block diagram of one example of an amplifier and current controller according to aspects of the present invention.

Accurate control of the DC bias current in radio frequency (RF) amplifiers used in a variety of applications, including CATV applications, can be an important design requirement to meet performance specifications. Aspects and embodiments are directed to control circuitry that can provide accurate, adjustable DC bias current control, for example, to within about 1%, and eliminate the need for costly (and often inaccurate) on-die laser trimming of resistors, as is conventionally required. According to certain embodiments, the control circuitry is configured to set and hold the RF amplifier DC current, also referred to herein as the bias current, independent of device parameters (e.g., whether the amplifier uses bipolar junction transistor (BJT) devices or field effect transistor (FET) devices) and independent of the DC power supply voltage. In addition, as discussed below, the control circuitry can be configured to set and hold the RF amplifier DC bias current independent of process resistor sheet resistance variation on the amplifier die. As discussed further below, the DC bias current may be adjustable by a user, allowing the same control module to be used with a variety of different amplifiers and in different applications. Further, as discussed in more detail below, the control circuitry can be configured to keep the DC bias current constant even if the active RF device parameters change over time (device aging), and over a range of different RF output power levels. In addition, in certain embodiments, the RF amplifier bias current variation with temperature is programmable, which may be useful to maintain a desired distortion profile over temperature. The current control circuitry and techniques according to embodiments disclosed herein provide a flexible, robust approach for setting and maintaining a desired DC bias current that can applied to a variety of different RF amplifier architectures and over a wide range of operating conditions (e.g., a range of RF power levels and/or desired DC current levels, changing temperature, etc.).

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Referring to FIG. 1, there is illustrated a block diagram of one example of a current controller 100 in combination with an RF amplifier die 200. As shown, the current controller 100 includes an operational amplifier ("op-amp") 110 and a current source 120. The current controller 100 is implemented on a controller die 130, which may be a CMOS die, for example. In certain examples, the controller die 130 is dedicated to the current controller 100; in other examples, the controller die 130 may be shared by the current controller 100 and other circuitry and/or components used for other functions in an overall module or device in which the current controller 100 is used. The controller die 130 includes at least three contacts (e.g., pins or pads) 132, 134, 136, for connecting the current controller 100 to the amplifier die 200, as discussed further below. The amplifier die 200 includes an RF amplifier, represented schematically in FIG. 1 by amplifier (transistor) 210. Those skilled in the art will appreciate that the RF amplifier 210 in practice may include a plurality of transistors and/or multiple amplification stages, and the single transistor shown in FIG. 1 is intended to be representative only and not limiting in terms of implementation of the RF amplifier 210. In certain examples, such as a cascode amplifier configuration, for example, the RF amplifier 210 may represent the common source transistor(s), or DC current-setting stage, of the overall amplifier architecture. The amplifier die 200 further includes a current sensing resistor 220 (Rs) and a reference resistor 230 (Rref). Again, the current sensing resistor 220 and the reference resistor 230 are schematically represented in FIG. 1 by single resistors, but may each be implemented in practice by any configuration or network of one or more resistive components. The amplifier die 200 may be a GaN, GaAs, or pHEMT die, for example.

The current source 120 on the controller die 130 forces a current into the reference resistor 230 on the amplifier die 200. This creates a voltage (Vref) across the reference resistor 230 that is applied at one of the inputs of the op-amp 110. The other input of the op-amp 110 receives a sense voltage (Vs) across the current sensing resistor 220. The output of the op-amp 110 is connected to the gate of the RF amplifier 210 via a gate resistance 240, and increases or decreases in voltage to make the voltage Vs equal to Vref. The DC bias current in the amplifier (Id) is equal to Vs/Rs. Thus, by controlling the voltage Vs, the control loop implemented by the op-amp 110 holds this current (Id) constant. Further, the value of the amplifier DC bias current, Id, can be determined by measuring the voltage, Vs, provided that the value of Rs is known. In certain examples, the current source 120 may be programmable to a desired value, as discussed further below.

Figure 2A:
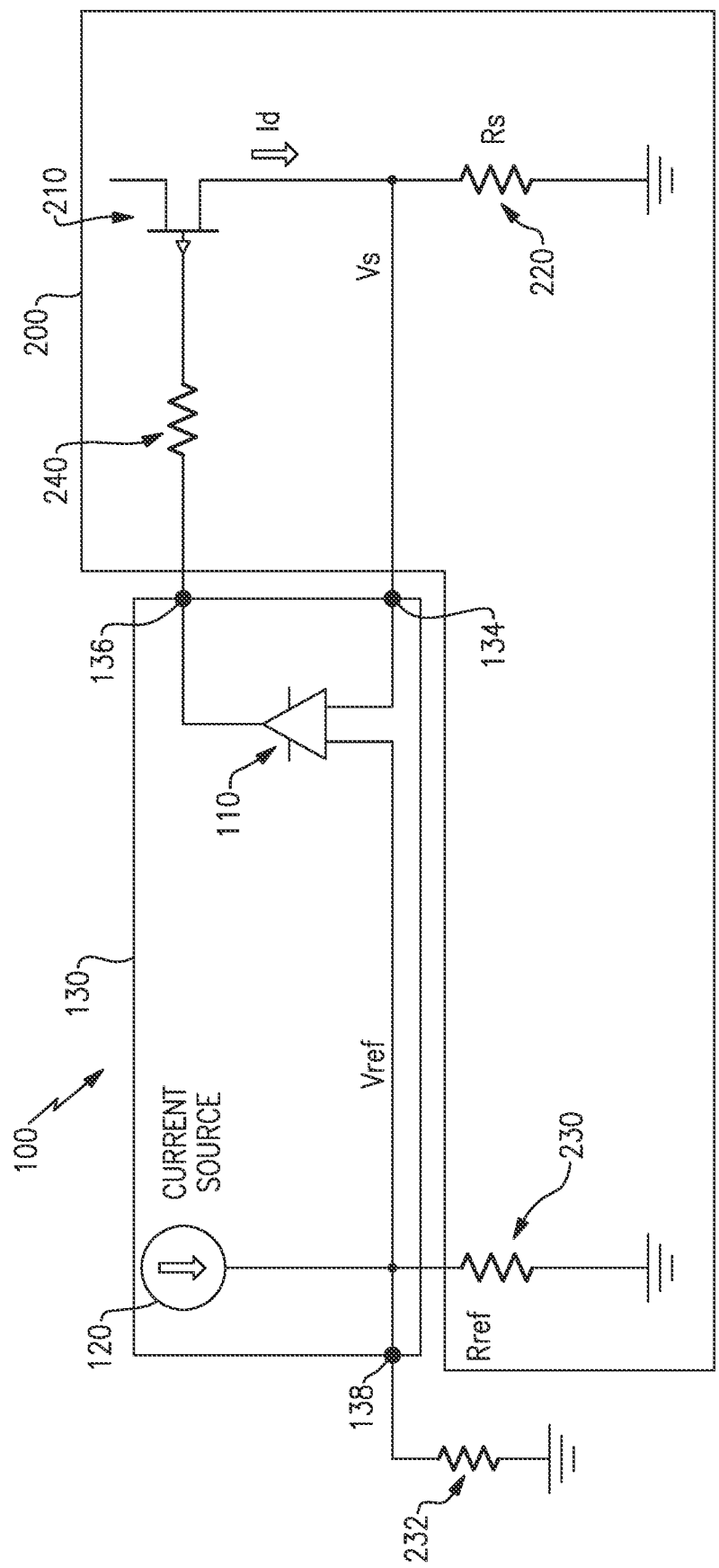
FIG. 2A is a block diagram of an example of a variation of the amplifier and current controller of FIG. 1, according to aspects of the present invention.
Figure 2B:
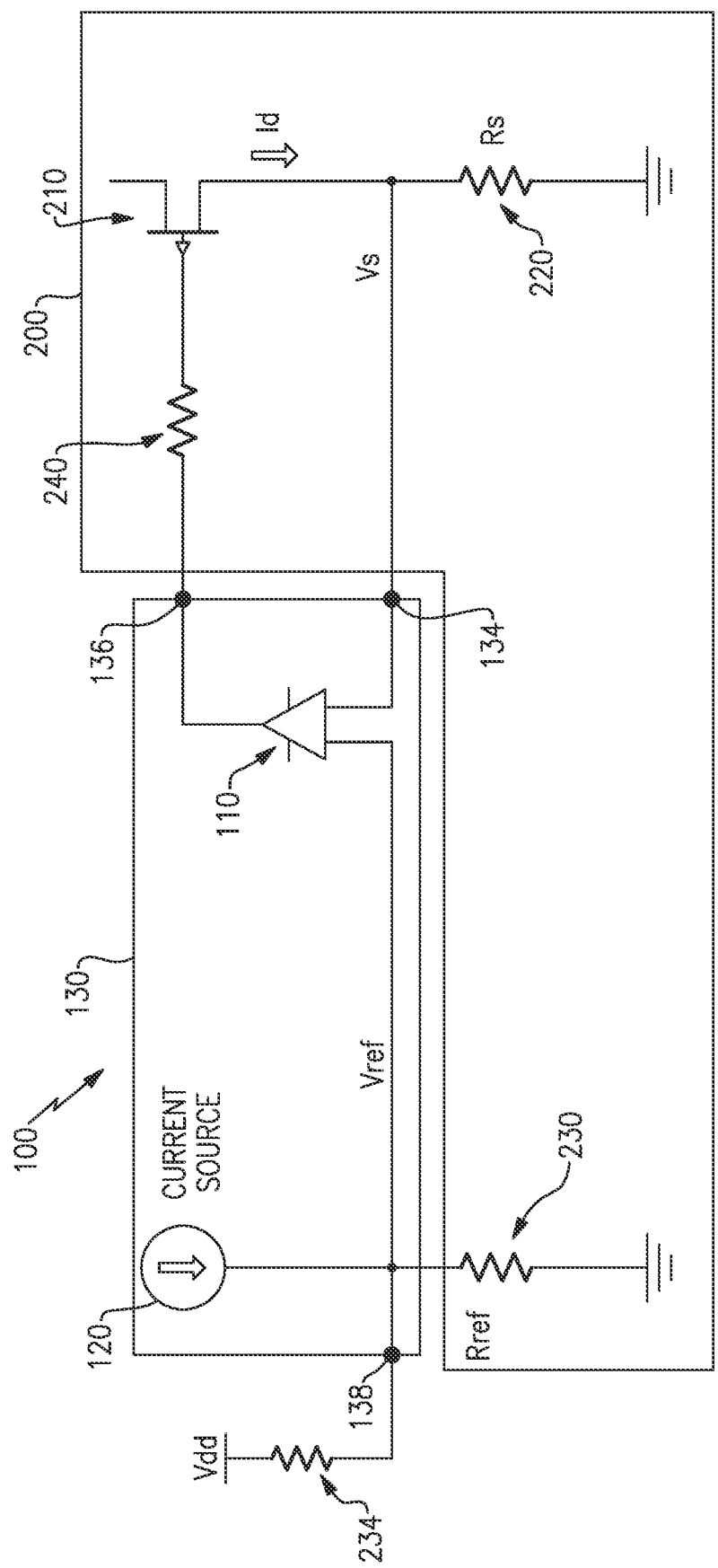
FIG. 2B is a block diagram of another example of a variation of the amplifier and current controller of FIG. 1, according to aspects of the present invention.

The value of the amplifier DC bias current, Id, can be set to a desired amount by selecting a value of the reference resistor 230. In certain examples, the bias current can be adjusted by a user. For example, a user can lower the amplifier DC current, Id, by connecting a shunt resistor 232 to ground in parallel with the reference resistor 230, as shown in FIG. 2A. Similarly, the user can increase the amplifier DC current, Id, by adding a pull-up resistor 234 from the reference resistor 230 to the supply voltage, Vdd, as shown in FIG. 2B. In certain examples, the controller die 130 can be provided with a contact 138 connected to the reference resistor 230 to which the user can connect the shunt resistor 232 or pull-up resistor 234. The contact 138 may be the same or different from the contact 132 shown in FIG. 1. In other examples, the amplifier die 200, instead of the controller die 130, can be provided with the contact 138 to allow the user to connect the shunt resistor 232 or pull-up resistor 234 to the reference resistor 230 to adjust the value of Id. In addition, although not shown in FIG. 1 or 2A-B, in certain examples, a shunt resistor may be connected to the contact 134 in parallel with the sense resistor 220 to lower the DC bias current, Id. In all cases, once the desired value of the amplifier DC current, Id, has been selected, for example, through selection of the value of the reference resistor 230 and any adjustment using the shunt resistor 232 or pull-up resistor 234, or adjustment of the sense resistor 220, the current controller 100 holds the current constant at the set value.

The current controller 100 may set and hold the amplifier DC current, Id, independent of the parameters or configuration of the RF amplifier 210. For example, the RF amplifier 210 may be implemented using BJT, FET, or pHEMT devices in a single-ended or differential configuration. The same current controller 100 can be used in any case and operates in the same manner, regardless of the configuration of the RF amplifier 210. The current controller 100 may also set and hold the amplifier DC current, Id, independent of the DC power supply voltage (Vdd). The current controller 100 compensates for a variety of factors, such as process variations, drift or changing of the RF amplifier 210 parameters over time (device aging), and dependence of the RF amplifier 210 threshold voltage on the DC supply or temperature, by sensing the amplifier bias current (Id) and controlling the gate voltage of the RF amplifier 210 to thereby maintain the amplifier bias current at the desired value. As discussed above, the amplifier bias current, Id, is sensed using the sensing resistor 220. As shown in FIG. 1, the sensing resistor 220 may be the RF amplifier degeneration resistor (connected on the source/emitter), which provides broadband linear operation.

As the control loop implemented by the current controller 100 measures the actual amplifier DC current, Id, it also suppresses any bias changes resulting from changes in the RF output power level. Typically, in conventional RF amplifier designs, the amplifier DC current tends to vary at higher RF output power levels, which may be undesirable. The current controller 100 advantageously provides a solution to this problem. In addition, the current controller 100 may set and maintain the amplifier DC current, Id, independent of process resistor sheet resistance variation on the amplifier die 200. Because both the sensing resistor 220 (used to measure the sense voltage Vs) and the reference resistor 230 (used to measure the reference voltage Vref) are implemented on the amplifier die 200, any variation in the sheet resistance, whether due to process variation, temperature changes, or other factors, affects the values of the sensing resistor 220 and the reference resistor 230 in the same way. For example, if the value of the sensing resistor 220 increases by 10% due to changes in the sheet resistance of the amplifier die 200 (rho), the value of the reference resistor 230 increases by the same amount. Therefore, the amplifier DC bias current, Id, remains constant.

According to certain embodiments, the current controller 100 can be configured such that the RF amplifier DC bias current, Id, is fixed over temperature, for at least a range of operating temperatures. According to other embodiments, the current controller 100 can be configured such that the variation of the RF amplifier DC current, Id, is programmable. This may be beneficial to maintain desired distortion characteristics of the RF amplifier 210 over temperature. For example, the current controller 100 can be configured such that the RF amplifier DC current, Id, can be programmed with a particular temperature coefficient to maintain linearity of the RF amplifier 210 over temperature.

Figure 3:
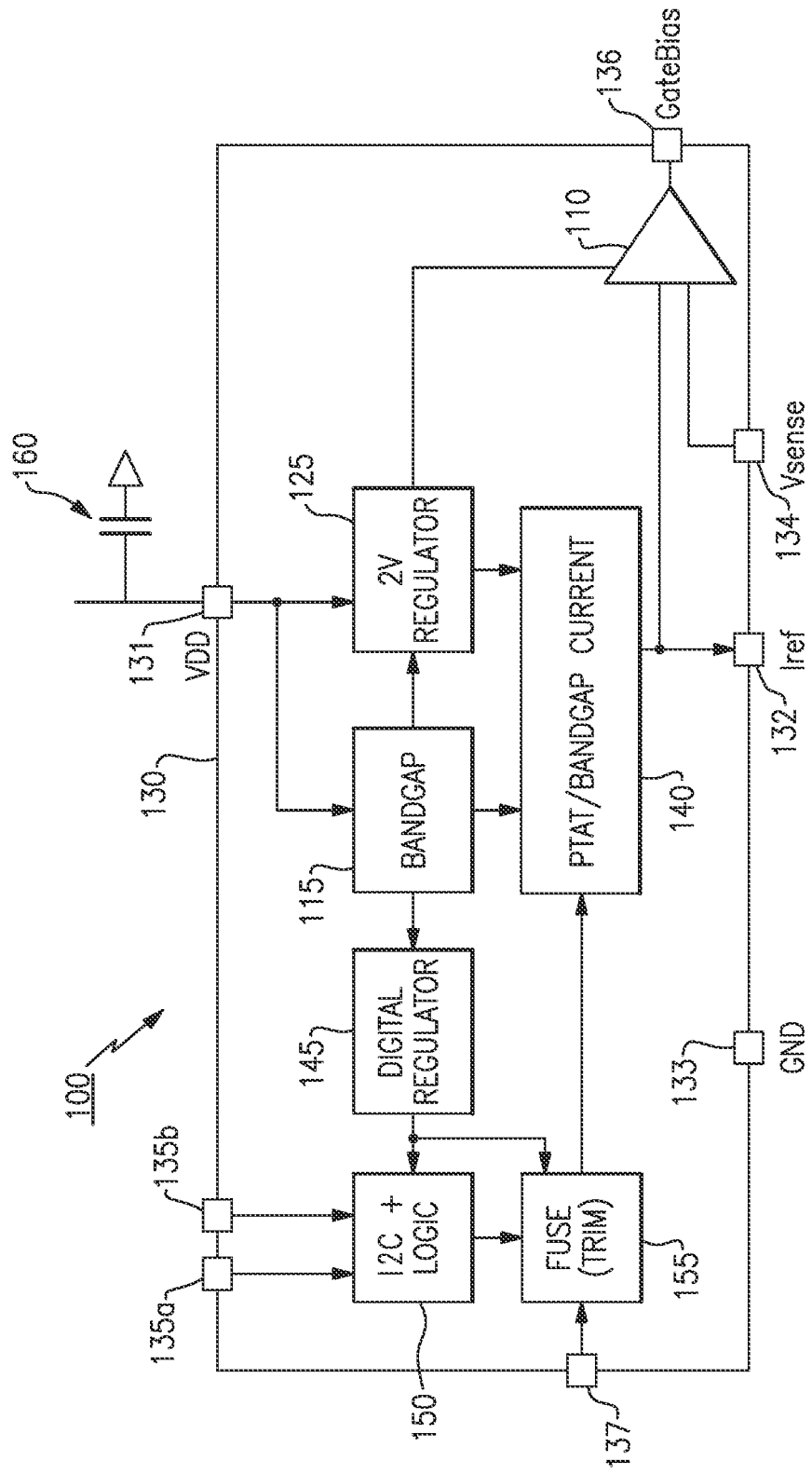
FIG. 3 is a block diagram of one example of a current controller according to aspects of the present invention.

Referring to FIG. 3, there is illustrated a block diagram of one example of an implementation of the current controller 100 according to certain embodiments. The current controller 100 may include various components to implement the current source 120 and enable programming of certain characteristics or parameters of the current controller 100 and/or the RF amplifier DC current, Id. In the illustrated example, the current controller 100 includes a voltage reference (bandgap) 115, a voltage regulator 125, and a programmable voltage reference 140 to implement the current source 120. The voltage reference 115 and voltage regulator 125 are both connected to a supply contact 131 through which the supply voltage (Vdd) is provided to the current controller 100. The programmable voltage reference 140 receives the outputs from the voltage reference 115 and the voltage regulator 125. The voltage regulator 125 is also connected to the supply contact of the op-amp 110 and regulates the supply voltage, Vdd, provided to the op-amp 110. The output of the programmable voltage reference 140 is connected to the contact 132 to supply the current to the reference resistor 230 on the amplifier die 200, as discussed above, and to one input of the op-amp 110 that is also connected to the contact 132, as also shown in FIG. 1. As discussed above with reference to FIG. 1, the other input of the op-amp 110 is connected to the contact 134 to receive the sense voltage, Vs, and the output of the op-amp 110 is connected to the contact 136, which can be connected to the gate of the RF amplifier 210 on the amplifier 200.

In certain examples, a capacitor 160 can be connected to the contact 131 for filtering, as discussed further below. The controller die 130 may further include one or more ground contacts 133 for connection to an external ground.

In the example of FIG. 3, the current controller 100 further includes a digital regulator 145, control logic 150, and programming circuitry 155. The digital regulator 145 regulates supply voltage/current provided from the voltage reference 115 to the control logic 150 and the programming circuitry 155. The control logic 150 may include a serial control interface for the current controller 100 to allow various parameters to be tested and adjusted during manufacture of the current controller 100. For example, as discussed above, the current value provided by the current source 120 may be programmable via the control interface. In addition, the current value of the current source 120 may be trimmable or adjustable through the control interface, whether or not it is programmable. In certain examples, programming may provide course adjustment of the current value, while trimming provides fine adjustment. In other examples where the current value is fixed (i.e., the current source 120 is not programmable), the current value may still be adjustable/trimmable through the control interface. The control interface may be a serial interface or a parallel interface. In some examples, the control interface may be configured to use a communication protocol such as I²C, SPI, etc. In the illustrated example, the controller die 130 include two contacts 135a, 135b, corresponding to a serial clock line and a serial data line, respectively, connected to the control logic 150 for receiving commands from external circuitry/components. These commands are used to set certain parameters of the current controller during manufacture, for example, at a testing or die sorting phase, so as to configure the current controller for a particular application. Accordingly, in certain embodiments, the contacts 135a, 135b may not be accessible after manufacture of the current controller 100 is complete.

The programming circuitry 155 can be used to program or "trim" various characteristics of the current controller 100 during the manufacturing of the current controller 100. As discussed above, in certain embodiments, the temperature dependence of the RF amplifier DC current, Id, (i.e., profile of changing current value with changing temperature) is programmable. This can be achieved using the programmable voltage reference 140 and the programming circuitry 155. For example, the programmable voltage reference 140 may have different operating modes, such as a mode in which the resulting RF amplifier DC current, Id, is constant with temperature and another mode in which the value of the RF amplifier DC current, Id, has a slope over temperature. The characteristics of the slope may be controlled by changing the value of a temperature coefficient that describes the slope. Through the programming circuitry 155, the operating mode of the programmable voltage reference 140 may be selected and/or the temperature coefficient may be selected or adjusted. Programming commands for the programming circuitry 155 may be received via the control logic 150 and serial control interface discussed above. The programmability of the programmable voltage reference 140 and the programming circuitry 155 may allow different embodiments of the current controller 100 to provide different temperature profiles of the RF amplifier DC current, for example, to optimize performance for different RF amplifier 210 configurations or different applications/modules in which the amplifier die 200 is used. As shown in FIG. 3, the current controller 100 may include a contact 137 connected to the programming circuitry 155 to allow testing of the programming circuitry 155 (for example, confirmation that the correct settings, operating mode of the programmable voltage reference 140, and the like have been programmed), during manufacturing. Accordingly, similar to the contacts 135a, 135b, the contact 137 may not be accessible after manufacture is complete.

According to certain embodiments, it is preferable for the op-amp 110 to have a very low offset voltage, or that the offset voltage (Vos) is trimmed or "canceled out" during production of the current controller 100. Accordingly, certain aspects are directed to trimming the offset voltage of the op-amp 110 to reduce the offset voltage to as close to zero as possible.

Figure 4:
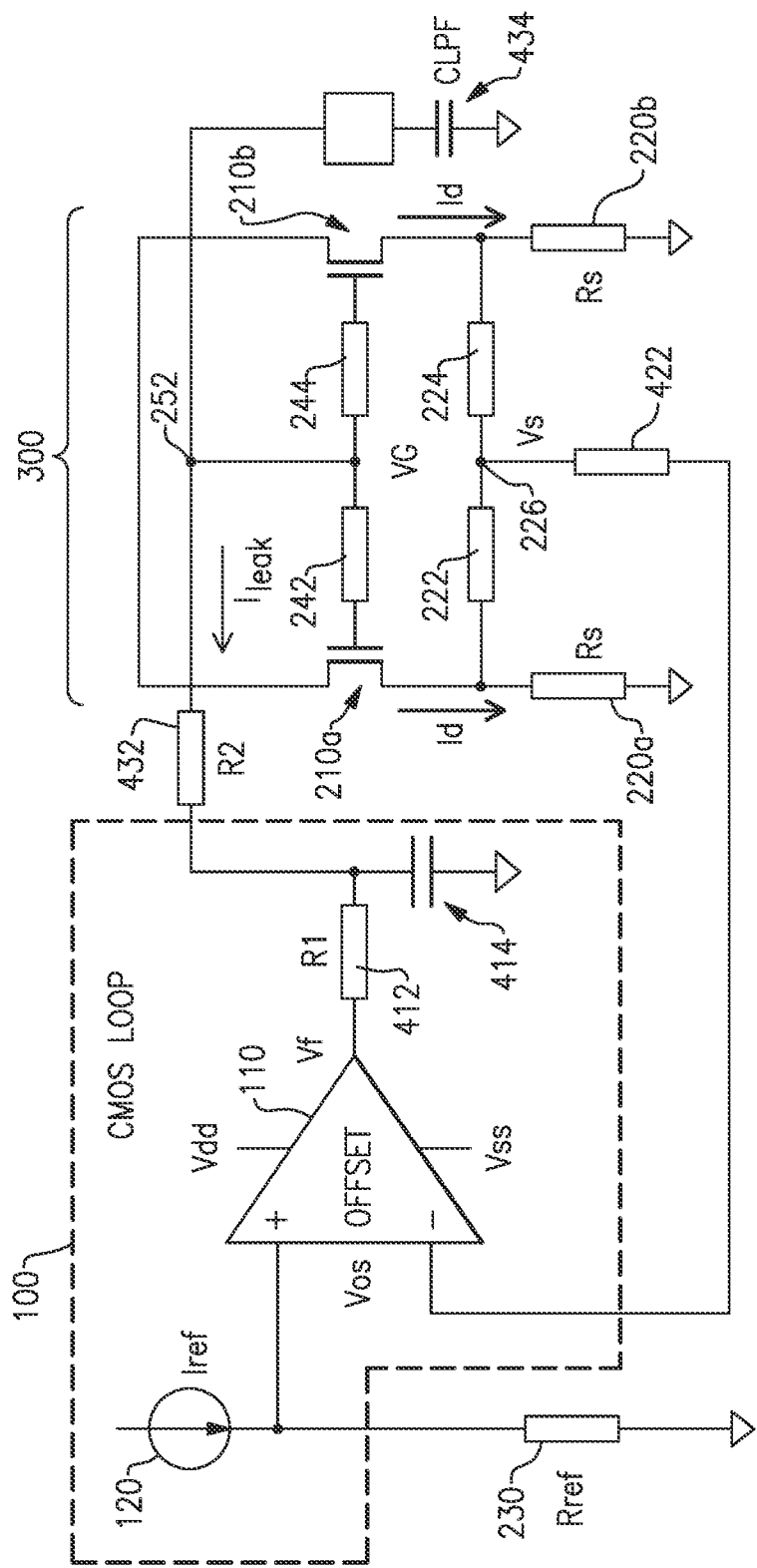
FIG. 4 is a schematic diagram of an example of a current controller and differential amplifier according to aspects of the present invention.

Referring to FIG. 4, there is illustrated a schematic diagram of one example of the current controller 100 in combination with an example of a differential RF amplifier 300. In the example of FIG. 1, the RF amplifier is represented schematically by the transistor 210, as discussed above. In FIG. 4, the RF amplifier 300 is represented schematically by a pair of complimentary transistors 210a, 210b, with their gates connected together via gate resistors 242, 244. Each of the transistors 210a, 210b is connected to a corresponding sensing resistor 220a, 220b, as shown. In both the examples of FIG. 1 and FIG. 4, the RF amplifier DC bias current, Id, is given by the following equation:

$$I_d = \frac{R_{ref}}{R_s} * I_{ref} + \frac{V_{os}}{R_s} \quad (1)$$

As may be seen from Equation (1), the RF amplifier DC current, Id, is proportional to reference current (Iref) produced by the current source 120, but is also affected by the offset voltage (Vos) of the op-amp 110. Accordingly, it is desirable to minimize Vos to ensure accurate setting of the desired current, Id. In certain embodiments, even small errors in the RF amplifier DC current, Id, (e.g., ~1% or 3.5 mA) can cause the gate voltage (VG) to drift to negative, adversely affecting the performance of the RF amplifier 300. Therefore, in certain examples, even if a low-offset op-amp 110 can be selected for the design of the current controller 100, the current controller 100 may be configured to further trim and reduce the offset to improve the accuracy of the RF amplifier DC current control. In certain examples where the trimming is performed before the current controller 100 is connected to (packaged with) the RF amplifier 300, the offset mitigation can be achieved by measuring the actual offset during die probe, for example, and compensating for the offset when programming the current Id by altering the target value by Vos/Rs.

In certain embodiments, the programming circuitry 155 can be configured to measure and trim the offset voltage of the op-amp 110 by adjusting parameters of one or more components of the current source 120, similar to as discussed above. In other examples, the current controller 100 can be configured with a self-calibration loop to reduce the offset voltage and/or variations in the offset voltage. In certain examples, the sensing resistor 220 on the amplifier die 200 may have a relatively low resistance value, and therefore any drift or other variation in the offset voltage of the op-amp 110 can have a large impact on the bias current, Id. According to one embodiment, the current controller 100 includes chopper circuitry to stabilize and remove, or reduce, the op-amp offset voltage, Vos.

Figure 5:
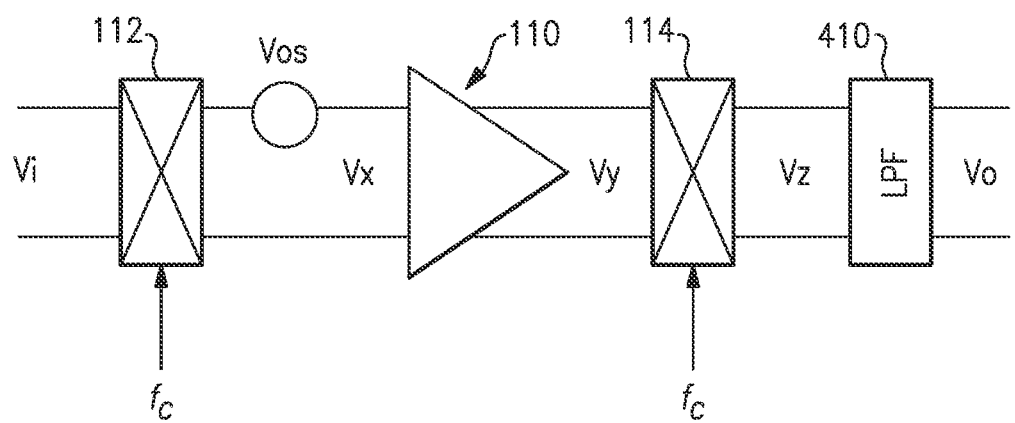
FIG. 5 is a block diagram of one example of a chop-stabilized feedback amplifier for use in a current controller according to aspects of the present invention.

FIG. 5 is a block diagram of one example of a chop-stabilized op-amp 110 that can be used in the current controller 100. The chopper circuitry includes switching circuits 112, 114 that are connected across the inputs (switching circuit 112) and outputs (switching circuit 114) of the op-amp 110, as shown. The switching circuits 112, 114 are configured to rapidly switch (or reverse) the inputs and outputs of the op-amp 110 back and forth. As a result, the off-set voltage, Vos, between the inputs rapidly changes from positive to negative and back, and therefore averages to approximately zero. The switching circuits 112, 114 operate at a rate or frequency, fc. The chopping technique may be continuous in the time domain, and may reduce the op-amp offset voltage to less than 1 µV, for example. In certain examples, use and/or operation of the chopper circuitry may be programmable. For example, through the control logic 150 and programming circuitry 155, the offset voltage, Vos, may be measured, and the chopper circuitry can be enabled or disabled, and/or the frequency, fc, may be altered to optimize performance based on, for example, parameters of a given op-amp 110 and/or specifications for a given application or module in which the current controller 100 is to be used. As shown in FIG. 5, in certain embodiments, a low pass filter (LPF) 410 may be included at the output of the op-amp 110 to reduce noise, such as ripples or harmonics at the op-amp output caused by the chopping.

Figure 6:
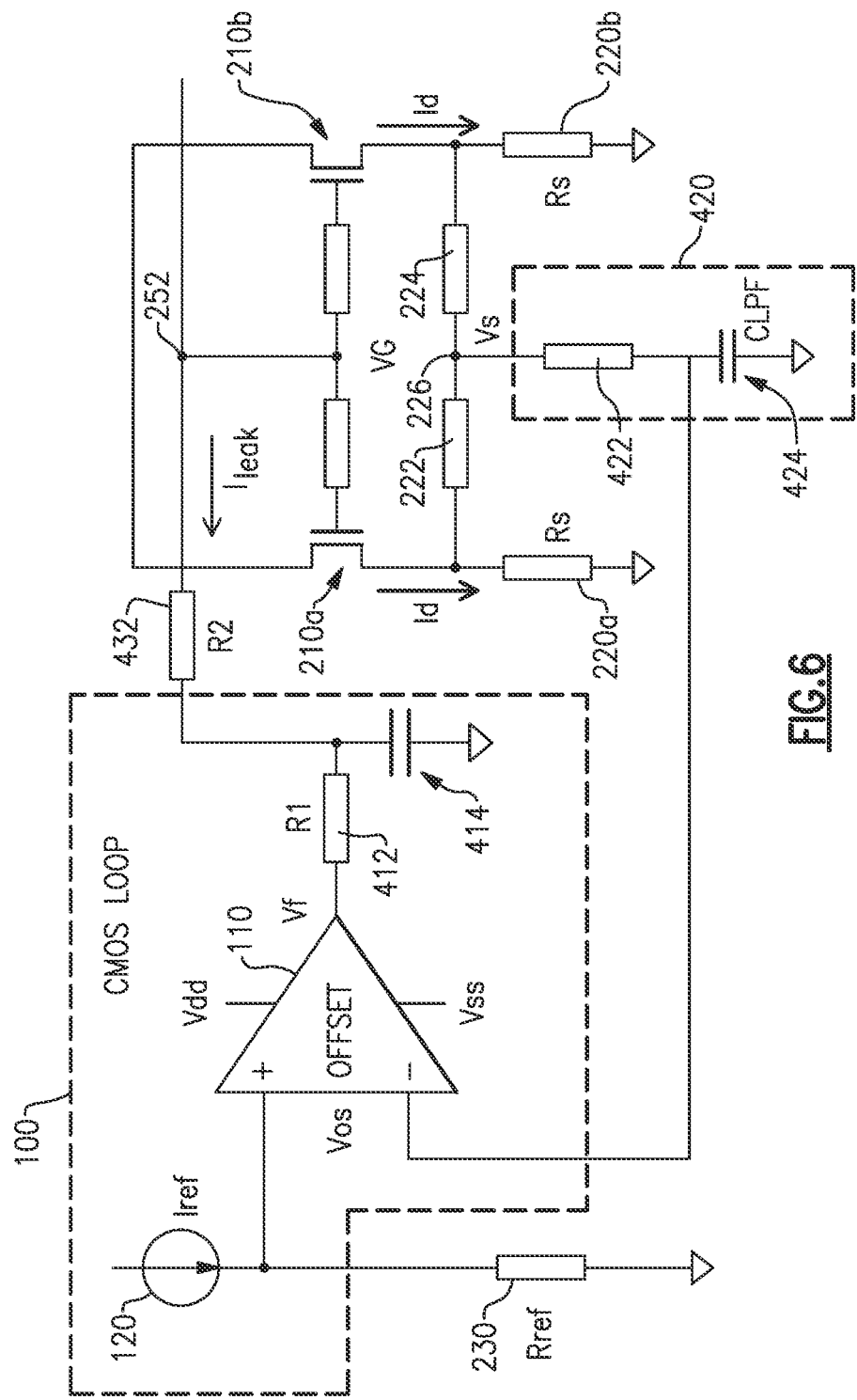
FIG. 6 is a schematic diagram of another example of a current controller and differential amplifier according to aspects of the present invention.

As noted above, according to certain embodiments, the current controller 100, and optionally also the amplifier die 200, can be configured with various filtering and other techniques to reduce noise and ensure accurate, consistent setting and holding of the RF amplifier DC bias current, Id. For example, referring again to FIG. 4, in the case of a differential RF amplifier 300, voltage sensing directly on the sensing resistors 220a, 220b may exhibit large RF voltage swings, and it is desirable to minimize any RF signal in the sense voltage Vs. Accordingly, rather than measuring the sense voltage across either (or both) sensing resistors 220a, 220b, a DC extraction circuit using common mode resistors 222 and 224 is added on the amplifier die 200, connecting the two sensing resistor nodes together, as shown in FIG. 4. Thus, a "virtual ground" is created at the common node 226 where differential RF voltage swings may be canceled out. The sense voltage, Vs, is measured across a common resistor 422 connected to the common node 226. In addition to using this common mode rejection to reduce the RF signal on the sense voltage, Vs, RC filtering can also be added. For example, referring to FIG. 6, an RC filter 420 can be added on the amplifier die 200 between the common node 226 at which the sense voltage, Vs, is measured and the input of the op-amp 110. The RC filter 420 includes a series combination of the common sensing resistor 422 and a capacitor 424. The input of the op-amp 110 can be connected between the common resistor 422 and the capacitor 424 to receive the sense voltage, Vs, and the capacitor 424 may shunt RF noise to ground. Although shown in FIG. 6 applied in the case of a differential RF amplifier 300, the RC filter may also be included in a single-ended RF amplifier configuration. For example, referring again to FIG. 1, a capacitor may be added in series with the sense resistor 220 (between the sense resistor 220 and ground) to perform RF filtering. Furthermore, the capacitor 424 may alternatively be implemented on the controller die 130, rather than the amplifier die 200. In other examples, the capacitor 424 may be implemented using a combination of capacitive elements on the amplifier die 200 and the controller die 130.

In certain applications, it may be required for the RF amplifier to operate over a very wide frequency range. For example, in CATV applications, the RF amplifier may operate over a range of approximately 50 MHz to 1.2 GHz. Accordingly, noise filtering on the any of the current controller lines and between the current controller 100 and the RF amplifier 210/300 may be required to meet communications standard specifications for noise, spurs, linearity, and the like. Examples of noise that may need to be filtered out include thermal noise of the current controller 100, any switching noise from an internal or external DC/DC regulated voltage supply, and any noise from the chopper circuitry discussed above. Referring again to FIGS. 4 and 5, as discussed above, in certain examples the current controller 100 may include a filter 410 on the output of the op-amp 110 to reduce noise, such as ripples or harmonics at the op-amp output caused by the chopping circuitry. In the example shown in FIG. 4, the filter 410 includes a resistor 412 and a shunt capacitor 414. However, in other examples (such as the example shown in FIG. 7 discussed below), the filter 410 may include multiple resistors 412 and/or multiple capacitors 414 in various configurations.

In addition to preventing noise from the current controller 100 from passing to the RF amplifier 210/300 (e.g., being present on the gate voltage, VG, of the RF amplifier 210/300), it may also be desirable to prevent RF noise, or leakage current ($I_{LEAK}$), from the RF amplifier 210/300 from passing to the current controller 100. Accordingly, additional filtering circuitry, such as an RC filter, may be connected between the current controller 100 and the RF amplifier 210/300. In certain examples, filtering components may be included on the RF amplifier die 200. For example, referring to FIG. 4, in certain examples, a resistor 432 may be connected in series with the resistor 412 between a node 252 between the gate resistors 242, 244 (at which the gate voltage, VG, is supplied to the transistors 210a, 210b of the RF amplifier 300), and a shunt capacitor 434 may be connected between the node 252 and ground, to provide an RC filter on the amplifier die 200. The embedded RC filter (e.g., resistor 432 and capacitor 434) on the amplifier die 200 may benefit from the low inductance of through-wafer vias (TWVs) that may be typically used to connect various components on the amplifier die 200 to the ground connection, and provide excellent high frequency filtering performance.

In certain examples, such as for GaAs- and GaN-implemented RF amplifiers, or other HBT/BJT, HEMT, or other transistor devices with gate current, RC filters may not be able to have very large R values because of the DC and RMS gate current from the RF amplifier 300 and the resulting voltage drop that may limit the bias range. As a result, in certain examples there is a need for smaller R values and large C values that may be difficult or impracticable to integrate on the amplifier die 200. In such cases, external discrete capacitors may be used. For example, referring to FIG. 7, a discrete external capacitor 440 may be connected to the contact 136 on the controller die 130 and to a corresponding contact 202 on the amplifier die 200 in a shunt configuration between the output of the op-amp 110 and the RF amplifier 300. The connections may be made using wirebonds 172, for example. In certain examples, the external capacitor 440 may have a value in a range of 100 nF-1 µF.

According to certain embodiments, various techniques are used to mitigate parasitic inductance. For example, referring to FIG. 7, certain examples employ the use of separate ground wire bonds 174 for the current controller 100, along with an embedded RC filter 410 (as discussed above). In some examples, the wirebond(s) 172 connected to the external capacitor 440 add a low inductance value to the filter 410, and the filter 410 uses one or more capacitors 414 with low C values (e.g., 50 pF), along with one or more resistors 412 as discussed above, to provide high frequency filtering. In the example shown in FIG. 7, the filter 410 includes a second order low pass filter for high frequency filtering, along with an additional resistor 416 to avoid anti-resonance with the external capacitor 440. In addition, in certain examples, a Kelvin connection to the external capacitor 440 may be used to minimize the effect of the package and/or wirebond inductance. For example, the external capacitor 440 may have a large C value, as discussed above, to provide low frequency filtering, and the Kelvin connection may be used for mid-range and high frequency filter optimization.

Figure 7:
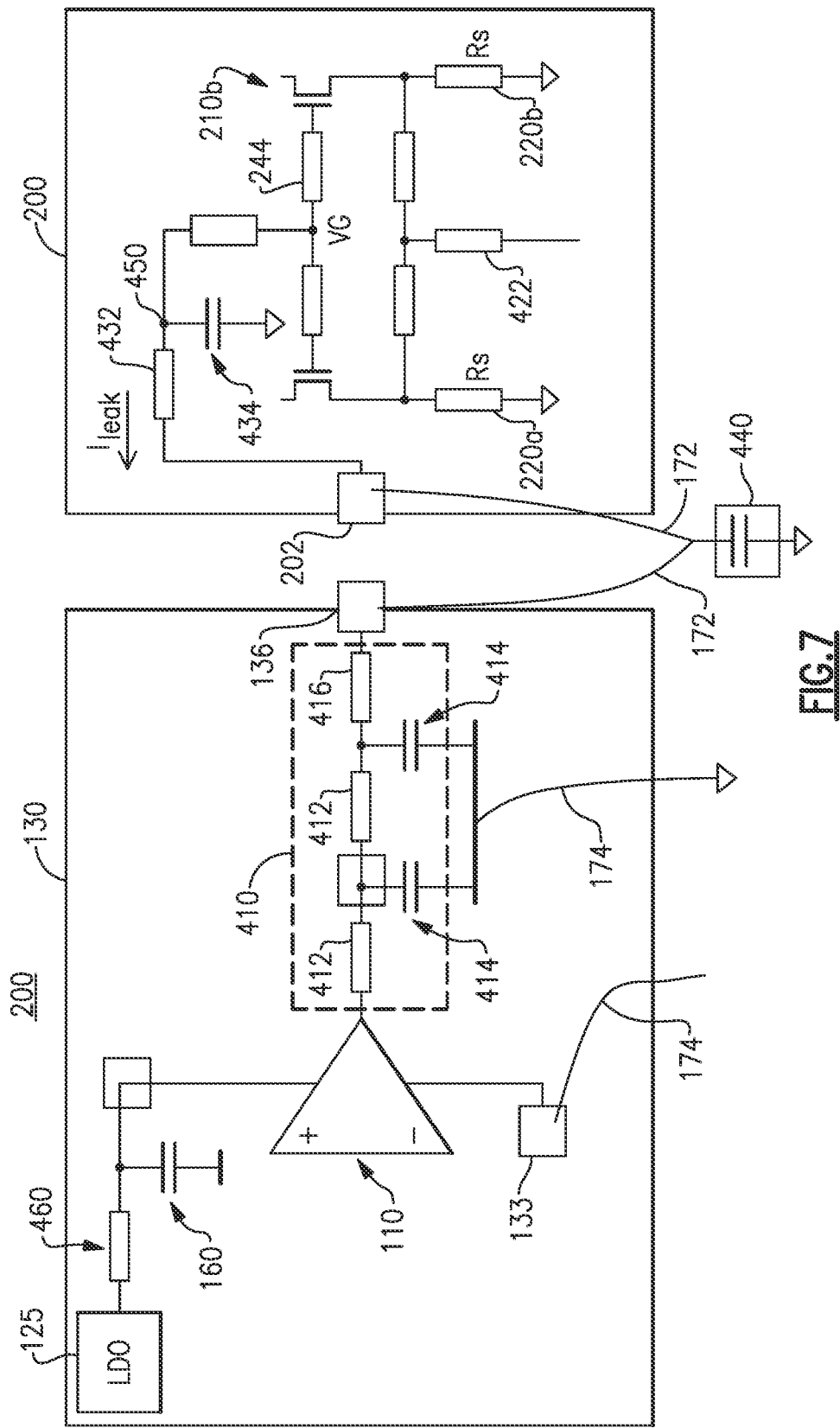
FIG. 7 is a schematic diagram of another example of a current controller and differential amplifier showing an example of filtering aspects according to aspects of the present invention.
Figure 8:
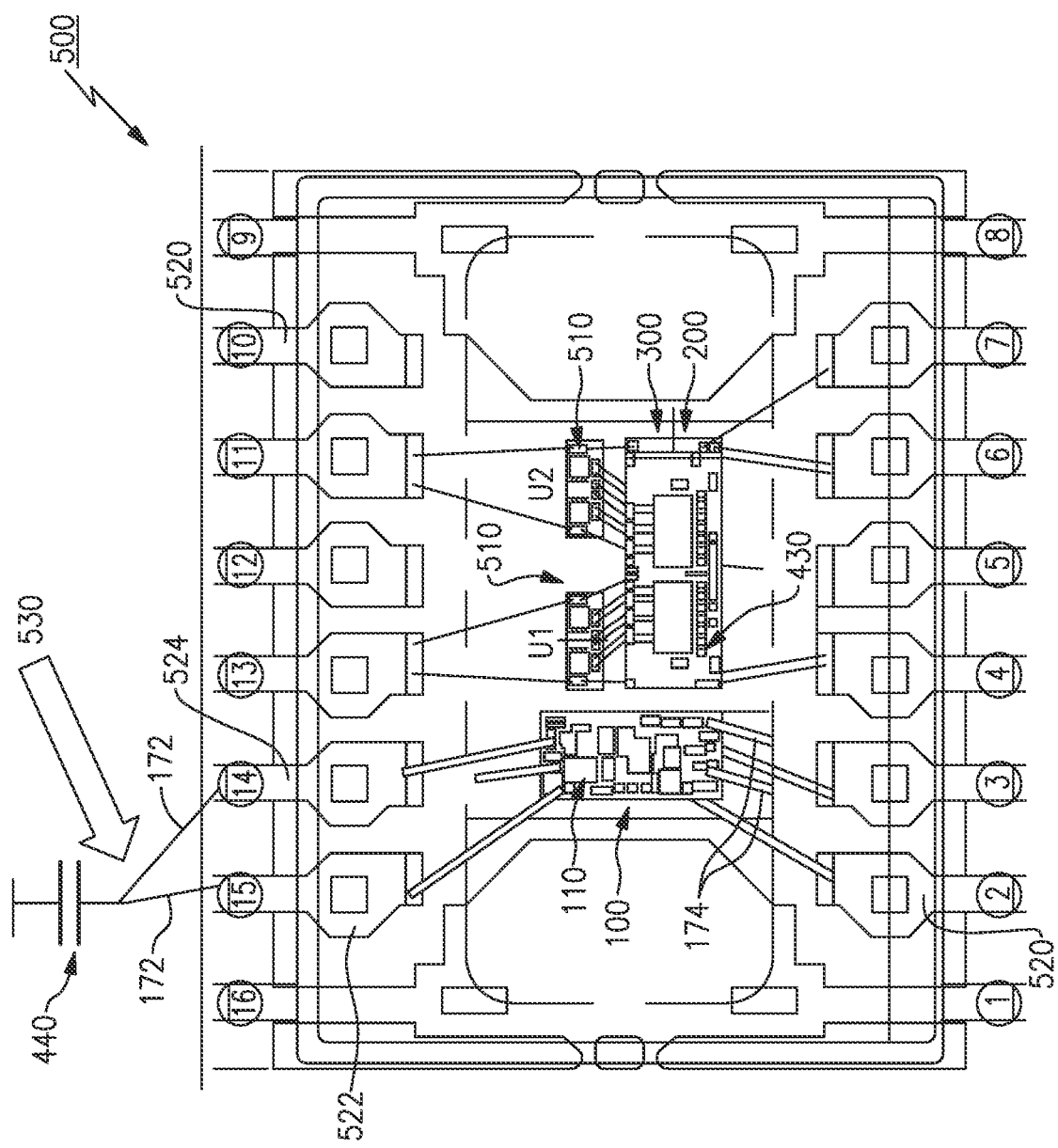
FIG. 8 is a diagram of one example of an amplifier module including an RF amplifier and current controller according to aspects of the present invention.

FIG. 8 is a diagram of one example of an amplifier module 500 with a built-in current controller 100. In this example, the RF amplifier includes a pHEMT example of the differential amplifier 300 (on the amplifier die 200) as an output stage for a cascode amplifier implemented on a pair of GaN dies 510 (U1 and U2). The amplifier die 200 includes an embedded RC filter 430 as discussed above (shown in example of FIG. 7 as including the resistor 432 and the capacitor 434). The module 500 includes a plurality of pins/leads 520 (sixteen in the illustrated example) for connection to external components. As discussed above the output of the op-amp 110 in the current controller 100 is connected to the external capacitor 440, and in FIG. 8, this connection is via lead 522. The external capacitor 440 is further connected to the RF amplifier 300 via lead 524. As discussed above, a Kelvin connection at 530 may be used to compensate for the lead inductance of the current controller die 130.

The combination of the above-discussed filtering aspects, including the use of separate ground wirebonds 174 for the current controller die 130, which includes an embedded RC filter 410 with low inductance (provided by the wirebonds 174) and low C values for high frequency filtering, along with the large C value external capacitor 440 and Kelvin connection, and the embedded RC filter 430 on the amplifier die, may provide broadband noise rejection over a large bandwidth (e.g., over the full CATV range of 50 MHz-1.2 GHz). To illustrate the filtering performance, simulations of a variety of different configurations were performed, and the results are shown in FIG. 9.

Figure 9:
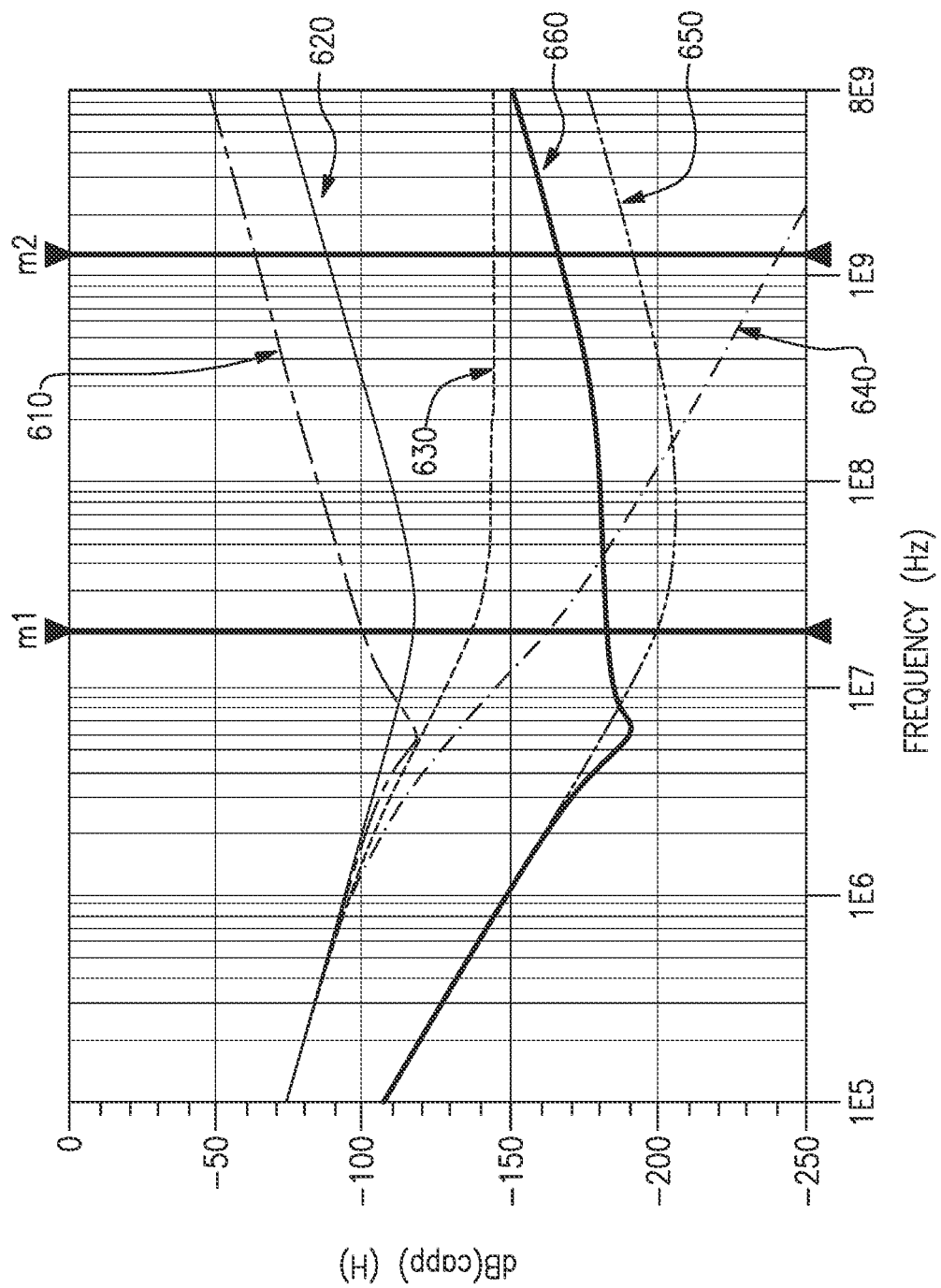
FIG. 9 is a graph showing simulated performance of various filtering configurations for examples of the amplifier and current controller combination of FIG. 7.

Referring to FIG. 9, the simulations were based on variations of the circuit configuration shown in FIG. 7, with components other than the filtering components 410, 430, 440, remaining the same in each simulation. The simulation used a +/−100 mV AC source at the DC/DC converter (negative charge pump) output used as the negative supply of op-amp 110 and connected to pin 133, and the voltage (vertical axis) was measured at node 450. The frequency band of interest, over which it is preferable that the measured voltage (representing the rejection of the overall filter) is lowest, is the frequency range between markers m1 and m2. In FIG. 9, trace 610 corresponds to an example in which there was no filter 430 (i.e., elements 432 and 434) on the amplifier die 200 and no Kelvin connection. The external capacitor 440 had a value of 200 nF. The filter 410 on the controller die 130 included only a single resistor 412 having a value of 4000 ohms. Trace 620 corresponds to an example that is the same as the example corresponding to trace 610, but with the addition of the Kelvin connection at 530. Trace 630 corresponds to an example in which the external capacitor 440 had a value of 200 nF, with the Kelvin connection at 530, and the filter 410 on the controller die 130 again included only the single resistor 412 with a value of 4000 ohms. In this example, the amplifier die 200 included the filter 430, with the resistor 432 having a value of 4000 ohms, and the capacitor 434 having a value of 20 pF. Trace 640 corresponds to the example shown in FIG. 7 and including the Kelvin connection at 530. For the filter 430 on the amplifier die 200, the resistor 432 had a value of 4000 ohms, and the capacitor 434 had a value of 20 pF. For the filter 410 on the controller die 130, the two resistors 412 each had a value of 1000 ohms, and the two shunt capacitors 414 each had a value of 50 pF. The additional resistor 416 had a value of 2000 ohms, and the external capacitor 440 had a value of 200 nF. As may be seen with reference to FIG. 9, this example (trace 640) provided improved performance over the examples corresponding to traces 610, 620, and 630. For comparison, trace 650 corresponds to an example that is the same as the example corresponding to trace 640, but with the addition of a second external capacitor connected to the contact 136 via an additional resistor on the controller die having a value of 1000 ohms. Trace 660 corresponds to an example that is the same as the example corresponding to trace 650, but without the Kelvin connection at 530. As may be seen by comparing traces 610 and 620, and comparing traces 650 and 660, addition of the Kelvin connection improves the filtering performance over the frequency range of interest.

Figure 10:
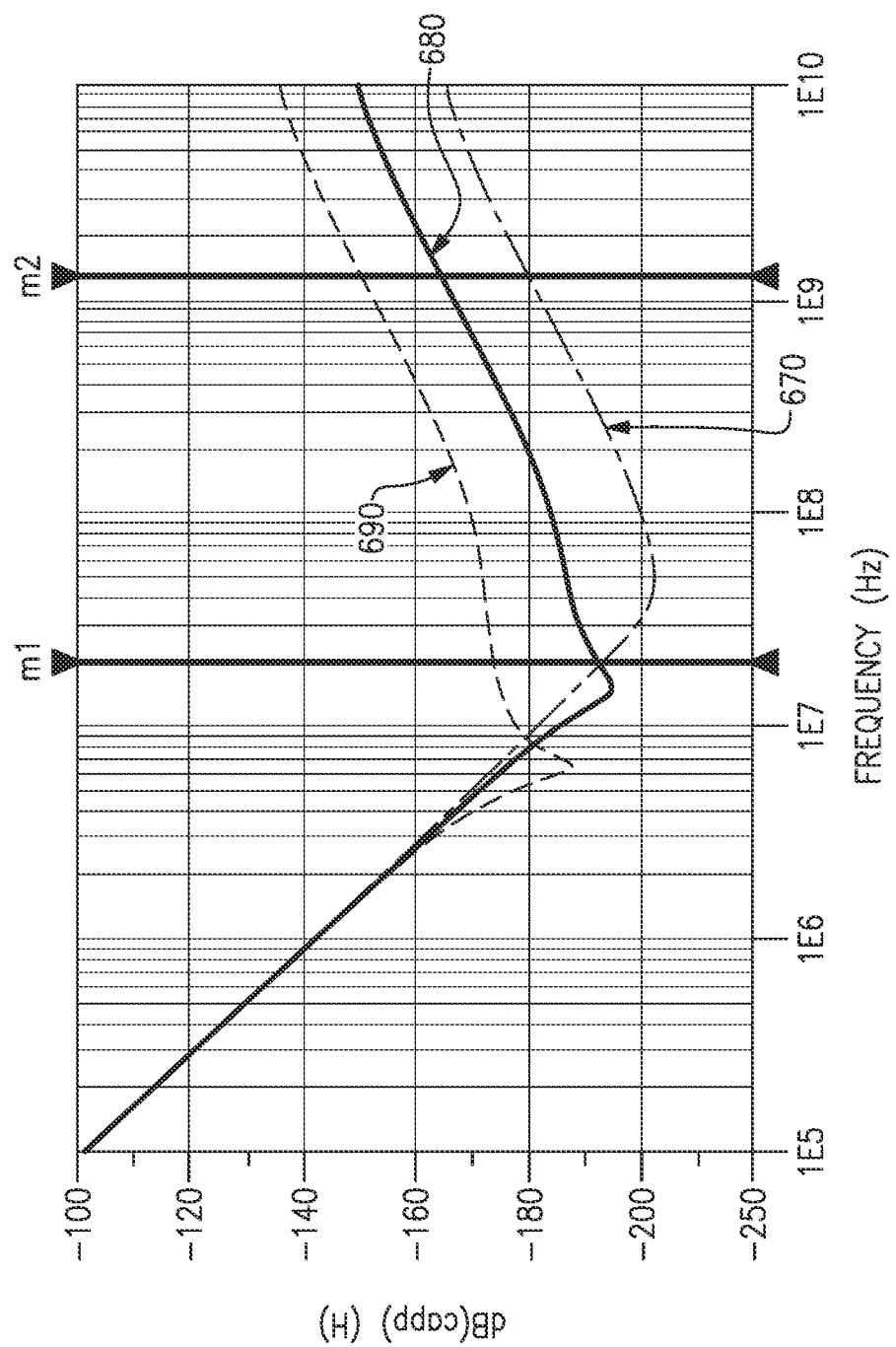
FIG. 10 is a graph showing simulated effects of mutual inductance and a Kelvin connection on filtering performance.

Referring again to FIG. 8, in certain instances, mutual inductance between adjacent pins/leads 522, 524 may negate or reduce the effect of the Kelvin connection at 530. FIG. 10 illustrates the results of simulations to demonstrate the effect of mutual inductance and the Kelvin connection on the filtering performance. In FIG. 10, trace 670 represents an example in which the Kelvin connection is present and mutual inductance between the adjacent leads 522, 524 is not accounted for. Trace 680 corresponds to an example including both the Kelvin connection and a mutual inductance of 1 nH. Trace 690 corresponds to an example without the Kelvin connection. In each of the three examples, all other filtering (and other) components were the same, to demonstrate only the effects of the Kelvin connection and the mutual inductance. As may be seen with reference to FIG. 10, although the mutual inductance may worsen the filtering performance, overall performance across the frequency range of interest (between m1 and m2) is still improved with the Kelvin connection versus without it.

Referring again to FIG. 7, in certain examples filtering may also be performed on the DC voltage supply to the op-amp 110, as discussed above with reference to FIG. 3. In one example, this filtering circuitry may include a resistor 460 connected between the voltage regulator 125 and the supply input of the op-amp 110 and the shunt capacitor 160. The resistor 460 may have a value selected to provide a specified voltage drop from the voltage regulator 125 to the supply contact of the op-amp 110. For example, a 10,000 ohm resistor may be used to achieve a 0.5 volt drop from the voltage regulator 125. The value of the shunt capacitor 160 may be selected to achieve maximum stability of the voltage regulator 125.

Thus, aspects and embodiments provide an approach for achieving accurate, stable, analog DC bias current control for RF amplifiers that is robust and flexible and avoids the need for costly on-die laser trimming of bias resistors. Embodiments of the current controller 100 disclosed herein case be used with a variety of different amplifier architectures, and are easily adjustable to accommodate process variations and different applications. Built-in filtering and feedback control may ensure accurate and stable setting and maintaining of the DC bias current, even as the RF amplifier components (such as any of the transistors used therein) may age and have parameters that change over time or with temperature, for example.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of controlling a DC bias current in an RF amplifier implemented on an amplifier die, the method comprising:
providing a reference current from a controller die to a reference resistor, the controller die being separate from the amplifier die;
providing an output voltage from the controller die to an input of the amplifier die, the output voltage controlling the RF amplifier;
controlling the DC bias current based on the output voltage;
providing the DC bias current to a sense resistor;
equalizing a reference voltage across the reference resistor with a sense voltage across the sense resistor; and
producing the output voltage based on the reference voltage and the sense voltage.

2. The method of claim 1 wherein the sense resistor and reference resistor are implemented on a same die.

3. The method of claim 2 wherein the sense resistor and reference resistor are implemented on the amplifier die.

4. The method of claim 1 wherein controlling the DC bias current includes:
receiving the reference voltage at a first input of a feedback amplifier implemented on the controller die;
receiving the sense voltage at a second input of the feedback amplifier;
producing the output voltage at an output of the feedback amplifier; and
controlling the RF amplifier by driving a gate node of the RF amplifier with the output voltage to control the level of the DC bias current.

5. The method of claim 4 further comprising trimming a value of the reference current to compensate for an offset value of the feedback amplifier.

6. The method of claim 2, the method further comprising producing the reference voltage by passing the reference current through the reference resistor.

7. The method of claim 2, the method further comprising producing the sense voltage by passing the DC bias current through the sense resistor.

8. The method of claim 1 further comprising adjusting a level of the reference current using a current controller.

9. The method of claim 1 further comprising adjusting a temperature-dependence profile of the DC bias current using a current controller.

10. A method of controlling a DC bias current in an RF amplifier implemented on an amplifier die, the method comprising:
providing a reference current from a controller die to a reference resistor, the controller die being separate from the amplifier die;
providing an output voltage from the controller die to an input of the amplifier die, the output voltage controlling the RF amplifier;
controlling the DC bias current based on the output voltage;
providing the DC bias current to a sense resistor;
equalizing a reference voltage across the reference resistor with a sense voltage across the sense resistor;
producing the output voltage based on the reference voltage and the sense voltage; and
adjusting the level of the DC bias current by altering a resistor value of the reference resistor by
lowering the level of the DC bias current by connecting a shunt resistor to ground in parallel with the reference resistor, or raising the level of the DC bias current by connecting a pull-up resistor from the reference resistor to the supply voltage.

11. An amplifier module comprising:
an amplifier die having a plurality of amplifier contacts;
a controller die having a plurality of controller contacts, the controller die being separate from the amplifier die;
an RF amplifier implemented on the amplifier die;
a programmable current controller implemented on the controller die, the programmable current controller including a current source and a feedback amplifier;
a reference resistor coupled to the current source and the feedback amplifier and having a reference voltage based on a reference current produced by the current source; and
a sense resistor coupled to the RF amplifier and the feedback amplifier and having a sense voltage based on a DC bias current produced by the RF amplifier.

12. The amplifier module of claim 11, the module further comprising:
a housing containing the amplifier die and the controller die;
a plurality of housing contacts;
a first plurality of leads connecting one or more of the housing contacts to one or more of the amplifier contacts; and
a second plurality of leads connecting one or more of the housing contacts to one or more of the controller contacts.

13. The amplifier module of claim 12, the module further comprising a capacitor coupled to a first connection lead of the plurality of connection leads and coupled to a second connection lead of the plurality of connection leads.

14. The amplifier module of claim 13 wherein the first connection lead is coupled to the controller die and the second connection lead is coupled to the amplifier die.

15. The amplifier module of claim 12 wherein at least one of the plurality of connection leads is a Kelvin connection.

16. The amplifier module of claim 11 wherein the programmable current controller includes a temperature-dependence profile of the DC bias current produced by the RF amplifier.

17. The amplifier module of claim 16 wherein the temperature-dependence profile of the DC bias current produced by the RF amplifier is adjustable to maintain linearity of the RF amplifier over a range of temperatures.

18. The amplifier module of claim 11 wherein the amplifier die further comprises a resistive-capacitive (RC) filter coupled in series with the sense resistor.

19. The amplifier module of claim 18 wherein the RC filter includes at least one through wafer via coupled to ground.

20. The amplifier module of claim 11 wherein the sense resistor and reference resistor are implemented on a same die.

* * * * *